(12) United States Patent
Chann et al.

(10) Patent No.: US 9,124,065 B2
(45) Date of Patent: Sep. 1, 2015

(54) SYSTEM AND METHOD FOR WAVELENGTH BEAM COMBINATION ON A SINGLE LASER EMITTER

(71) Applicant: TeraDiode, Inc., Wilmington, MA (US)

(72) Inventors: Bien Chann, Merrimack, NH (US); Robin Huang, North Billerica, MA (US); Parviz Tayebati, Sherborn, MA (US)

(73) Assignee: TeraDiode, Inc., Wilmington, MA (US)

( * ) Notice: Subject to any disclaimer, the term of this patent is extended or adjusted under 35 U.S.C. 154(b) by 0 days.

(21) Appl. No.: 13/927,093

(22) Filed: Jun. 25, 2013

(65) Prior Publication Data

US 2013/0287058 A1    Oct. 31, 2013

Related U.S. Application Data

(63) Continuation-in-part of application No. 13/042,042, filed on Mar. 7, 2011, now Pat. No. 8,553,327.

(60) Provisional application No. 61/663,735, filed on Jun. 25, 2012, provisional application No. 61/310,777, filed on Mar. 5, 2010, provisional application No. 61/310,781, filed on Mar. 5, 2010, provisional application No. 61/417,394, filed on Nov. 26, 2010.

(51) Int. Cl.
*G02B 27/64* (2006.01)
*H01S 3/0941* (2006.01)
*G02B 19/00* (2006.01)
*G02B 27/09* (2006.01)
*H01S 3/094* (2006.01)
*H01S 5/40* (2006.01)
(Continued)

(52) U.S. Cl.
CPC .......... *H01S 3/0941* (2013.01); *G02B 19/0014* (2013.01); *G02B 19/0028* (2013.01); *G02B 19/0057* (2013.01); *G02B 27/0905* (2013.01); *H01S 5/405* (2013.01); *H01S 3/09415* (2013.01); *H01S 3/094003* (2013.01); *H01S 3/094096* (2013.01); *H01S 5/005* (2013.01); *H01S 5/141* (2013.01); *H01S 5/4012* (2013.01); *H01S 5/4062* (2013.01); *H01S 5/4087* (2013.01); *H01S 2301/03* (2013.01)

(58) Field of Classification Search
CPC .................................................. G02B 27/0905
USPC ......................................................... 359/556
See application file for complete search history.

(56) References Cited

U.S. PATENT DOCUMENTS 6,044,096 A    3/2000    Wolak et al.
6,192,062 B1   2/2001    Sanchez-Rubio et al.
(Continued)

FOREIGN PATENT DOCUMENTS

JP    2007165624 A    6/2007
WO   2006/045303 A2   5/2006
(Continued)

*Primary Examiner* — James Jones
(74) *Attorney, Agent, or Firm* — Morgan, Lewis & Bockius LLP

(57) ABSTRACT

A system and method for reducing the $M^2$ value of a single asymmetric laser emitter while maintaining the power output of the emitter. In some embodiments the brightness of the output of such a system is equivalent to a portioned section of the single laser emitter. A WBC step is performed along a portioned or non-portioned single laser emitter to reduce the $M^2$ value.

10 Claims, 6 Drawing Sheets

(51) Int. Cl.
   *H01S 5/00*      (2006.01)
   *H01S 5/14*      (2006.01)

(56) References Cited

U.S. PATENT DOCUMENTS

| | | | |
|---|---|---|---|
| 6,356,576 | B1 | 3/2002 | Smith |
| 8,049,966 | B2 | 11/2011 | Chann |
| 2004/0095983 | A1 | 5/2004 | Whitley |
| 2004/0174604 | A1 | 9/2004 | Brown |
| 2004/0252744 | A1 | 12/2004 | Anikitchev et al. |
| 2006/0126690 | A1 | 6/2006 | Kido et al. |
| 2007/0002925 | A1 | 1/2007 | Zediker |
| 2010/0110556 | A1 * | 5/2010 | Chann et al. ............ 359/619 |
| 2011/0216417 | A1 | 9/2011 | Chann et al. |
| 2011/0216792 | A1 | 9/2011 | Chann et al. |
| 2011/0305250 | A1 | 12/2011 | Chann et al. |
| 2011/0305256 | A1 | 12/2011 | Chann et al. |
| 2011/0310921 | A1 | 12/2011 | Chann et al. |
| 2012/0105968 | A1 | 5/2012 | Chann et al. |
| 2013/0208361 | A1 | 8/2013 | Chann et al. |

FOREIGN PATENT DOCUMENTS

| | | |
|---|---|---|
| WO | 2006097531 A1 | 9/2006 |
| WO | 2011109760 A3 | 11/2011 |

* cited by examiner

SYSTEM AND METHOD FOR WAVELENGTH BEAM COMBINATION ON A SINGLE LASER EMITTER

COPYRIGHT STATEMENT

A portion of the disclosure of this patent application document contains material that is subject to copyright protection including the drawings. The copyright owner has no objection to the facsimile reproduction by anyone of the patent document or the patent disclosure as it appears in the Patent and Trademark Office file or records, but otherwise reserves all copyright rights whatsoever.

BACKGROUND OF THE INVENTION

1. Field of the Invention

The present embodiments relate generally to diode laser pumps and more particularly WBC diode laser pumps for high-power fiber amplifiers.

2. Description of the Prior Art

There is a compelling need for scaling fiber lasers and amplifiers to higher power and energy for industrial and military applications. The primary scaling roadblock today is the very limited brightness of diode laser pumps.

The main limitations for scaling single-frequency fiber lasers and amplifiers to higher power and higher energy are: 1) nonlinear optical effects both in the active and delivery fibers, 2) physical limitations, and 3) pump brightness. The nonlinear optics limitation is mainly due to stimulated Brillouin scattering (SBS). The physical limitations include thermal limitations (extractable power per unit length of fiber), thermal fracture, melting of the fiber core, thermal lensing, and damage limitations at the output facet. State-of-the-art single frequency fiber amplifiers are currently limited by pump brightness. Thus, much higher power can be extracted from the amplifiers if a higher brightness pump is available.

The following application seeks to increase pump brightness.

SUMMARY OF THE INVENTION

A system and method for using wavelength beam combining on a single laser emitter is provided.

In one embodiment, a beam emitted by a single laser emitter is divided into equal parts by an optical partitioning element. Those equal parts are received by a transform lens that causes the equal portions to converge onto a dispersive element. The equal parts are then combined and transmitted onto a partially reflective outpute coupler, wherein a portion of the combined parts is reflective back toward the dispersive element and into the single laser emitter.

In another embodiment the step of portioning the beam emitted by a single laser emitter is omitted and WBC is performed along the length of the beam, wherein an output having an M2 value less than 3 is produced.

DETAILED DESCRIPTION OF THE PREFERRED EMBODIMENT

For purposes of this application optical elements may refer to any of lenses, mirrors, prisms and the like which redirect, reflect, bend, or in any other manner optically manipulate electromagnetic radiation. Additionally, the term beam includes visible light, infrared radiation, ultra-violet radiation, and electromagnetic radiation. Emitters include any beam-generating device such as semiconductor elements, which generate a beam, but may or may not be self-resonating. These also include fiber lasers, disk lasers, non-solid state lasers and so forth. Generally each emitter is comprised of at least one gain element. For example, a diode element is configured to produce a beam and has a gain element, which may be incorporated into a resonating system.

It should also be understand that certain emitters mentioned in embodiments below, such as a diode element, may be interchanged with other types of beam emitters.

Figure 1A:
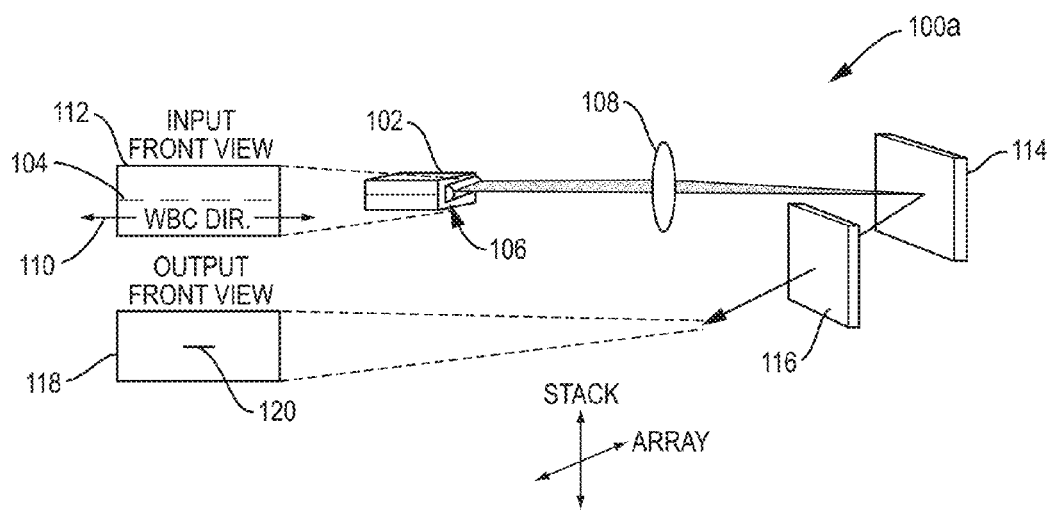
FIG. 1A is a schematic of a wavelength beam combining (WBC) method along the array dimension of a single row of emitters.

FIG. 1A illustrates a basic WBC architecture. In this particular illustration, WBC is performed along the array dimension or slow dimension for broad-area emitters. Individual beams 104 are illustrated in the figures by a dash or single line, where the length or longer dimension of the beam represents the array dimension or slow diverging dimension for broad-area emitters and the height or shorter dimension represents the fast diverging dimension. In this related art, a diode bar 102 having four emitters is illustrated. The emitters are aligned in a manner such that the slow dimension ends of each emitted beam 104 are aligned to one another side by side along a single row—sometimes referred to as an array. However, it is contemplated that any lasing elements may be used and in particular laser elements with broad gain bandwidth. Typically a collimation lens 106 is used to collimate each beam along the fast diverging dimension. In some cases the collimation optics can be composed of separate fast axis collimation lenses and slow axis collimation lenses. Typically, transform optic 108 is used to combine each beam along the WBC dimension 110 as shown by the input front view 112. Transform optic 108 may be a cylindrical or spherical lens or mirror. The transform optic 108 then overlaps the combined beam onto a dispersive element 114 (here shown as a reflecting diffraction grating). The first-order diffracted beams are incident onto a partially reflecting mirror. A laser resonator is formed between the back facet of the laser elements and the partially reflecting mirror. As such, the combined beam is then transmitted as a single output profile onto an output coupler 116. This output coupler then transmits the combined beams 120, as shown by the output front view 118. It is contemplated creating a system devoid of an output coupler. For instance, a one-dimensional or two-dimensional system with wavelength stabilized laser elements and each having a unique wavelength can be accomplished a few ways. One system or method uses laser elements with feedback from an external wavelength chirped Volume Bragg grating along the beam combining dimension. Another uses internal distributed feedback (DFB) laser elements or internal distributed Bragg reflector (DBR) laser elements. In these systems, the single output profile transmitted from the dispersive element would have the same profile as 118. The output coupler 116 may be a partially reflective mirror or surface or optical coating and act as a common front facet for all the laser elements in diode array 102. A portion of the emitted beams is reflected back into the optical gain and/or lasing portion of diode array 102 in this external cavity system 100a. An external cavity is a lasing system where the secondary mirror is displaced at a distance away from the emission aperture or facet (not labeled) of each laser emitter. Generally, in an external cavity additional optical elements are placed between the emission aperture or facet and the output coupler or partially reflective surface.

Figure 1B:
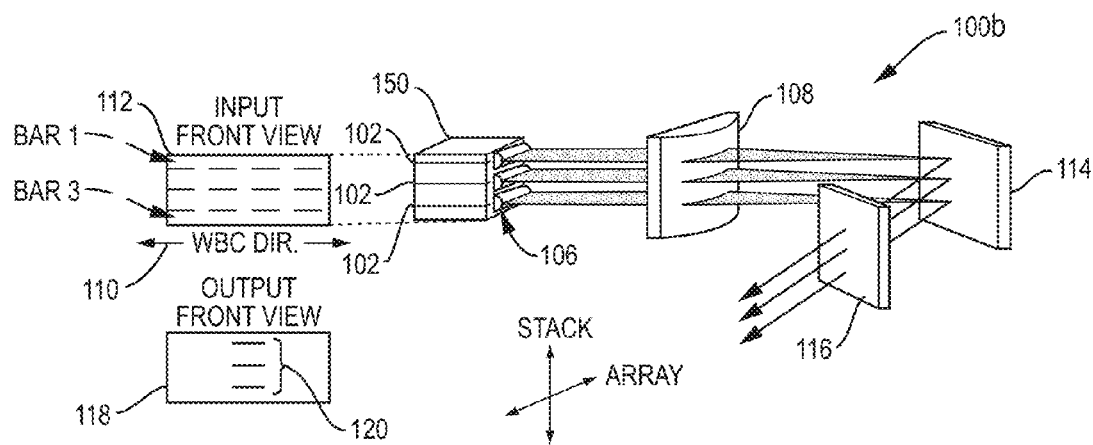
FIG. 1B is a schematic of a WBC method along the array dimension of a two-dimensional array of emitters.

Similarly, FIG. 1B illustrates a stack of laser diode bars each having four emitters where those bars are stacked three high. (See also left side of FIG. 8. Like FIG. 1A, the input front view 112 of FIG. 1B, which in this embodiment is a two-dimensional array of emitters, is combined to produce the output front view 118 or a single column of emitters 120. The emitted beams in external cavity 100b were combined along the array dimension. Here transform optic 108 is a cylindrical lens used to combine the beams along the array. However, a combination of optical elements or optical system can be used as such that the optical elements arrange for all the beams to overlap onto the dispersive element and make sure all the beams along the non-beam-combining dimension are propagating normal to the output coupler. A simple example of such an optical system would be a single cylindrical lens with the appropriate focal length along the beam-combining dimension and two cylindrical lenses that form an afocal telescope along the non beam-combining dimension wherein the optical system projects images onto the partially reflecting mirrors. Many variations of this optical system can be designed to accomplish the same functions.

The array dimension FIG. 1B is also the same axis as the slow dimension of each emitted beam in the case of multi-mode diode laser emitters. Thus, this WBC system may also be called slow axis combining, where the combining dimension is the same dimension of the beams.

Figure 1C:
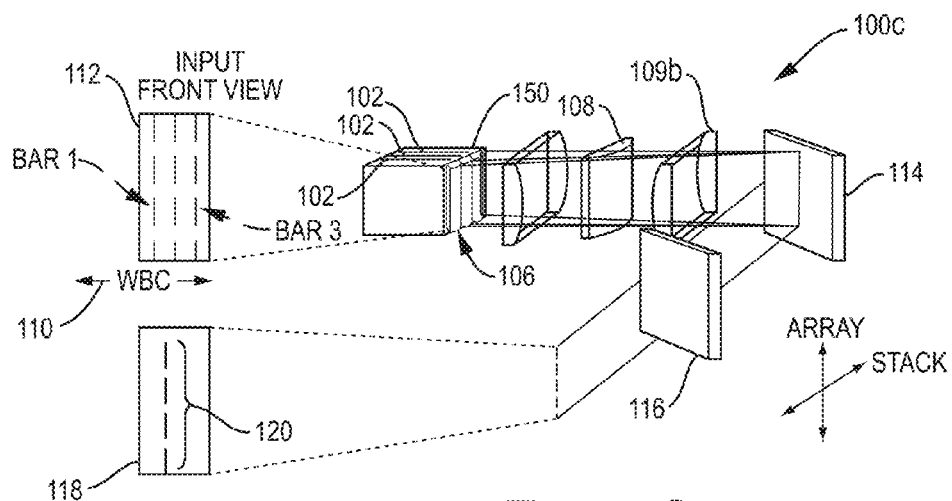
FIG. 1C is a schematic of a WBC method along the stack dimension of a two-dimensional array of emitters.

By contrast, FIG. 1C illustrates a stack 150 of laser diode arrays 102 forming a two-dimensional array of emitters, as shown by 120, where instead of combining along the array dimension as in FIGS. 1A-B, the WBC dimension now follows along the stack dimension of the emitters. Here, the stacking dimension is also aligned with the fast axis dimension of each of the emitted beams. The input front view 112 is now combined to produce the output front view 118 wherein a single column 120 of emitters is shown.

There are various drawbacks to all three configurations. One of the main drawbacks of configuration shown in FIGS. 1A and 1B is that beam combining is performed along the array dimension. As such external-cavity operation is highly dependent on imperfections of the diode array. If broad-area semiconductor laser emitters are used the spectral utilization in the WBC system is not as efficient as if beam combining is performed along the fast axis dimension. One of the main drawbacks of configurations shown in FIG. 1C is that external beam shaping for beam symmetrization is required for efficient coupling into a fiber. The beam symmetrization optics needed for a high power system having a large number of emitters may be complex and non-trivial. Another disadvantage of configuration 1C is that the output beam quality is limited to that of a single laser bar. Typical semiconductor or diode laser bars have 19 to 49 emitters per bar with nearly diffraction-limited beam quality in one dimension and beam quality that is several hundreds of times diffraction-limited along the array dimension. After beam symmetrization the output beam 120 can be coupled into at best a 100 μm/0.22 Numerical Aperture (NA) fiber. To obtain higher beam quality a small number of emitter bars is needed. For example to couple into 50 μm/0.22 NA fiber a five-emitter output beam is needed. In many industrial laser applications a higher brightness laser beam is required. For example, in some applications a two-emitter output beam is needed instead of 19 or 49. The two-emitter output beam can be coupled to a smaller core diameter fiber with much more engineering tolerance and margin. This additional margin in core diameter and NA is critical for reliable operation at high power (kW-class) power levels. While it is possible to procure five-emitter or two-emitter bars the cost and complexity is generally much higher as compare to a standard 19 or 49 emitter bars because of the significantly reduced power per bar. In this disclosure, we disclose methods to remove all of the above short comings.

Performing WBC on a Single Emitter

The previous description referred to combining multiple emitters from a single diode bar or equivalent. By using WBC and shaping technology of commercially available diode laser bars, direct diode lasers with output power and beam quality that are comparable to fiber and solid state lasers are possible. By applying similar principles, the present application seeks to produce a nearly diffraction limited diode laser system starting with a diode laser pump.

One key aspect to producing a high-brightness diode pump is to start with a multi-mode single emitter diode laser. The multi-mode single emitter can be very wide in width to maximize output power. For example, Axcel photonics makes a 600-micron wide single emitter at 975 nm with 35 to 40 W of output power.

In one embodiment, beam shaping optics are used to partition the output beam from the single emitter into equivalent high brightness partitions. See FIG. 2A. One example of a beam shaping optic to be used is the V-step module from Ingeneric. The V-Step-Module permits an emitter array to be coupled efficiently to multi-mode fibers.

V-Step-Module module transforms the unsymmetrical beams from the emitters in fast and slow-axis into a symmetrical profile with the same level of divergence in both directions of propagation.

The advantages this brings, include the outstanding efficiency of the module, variability with regard to the number and form of the emitters which can be coupled in, the diameter of the fibers and the ease with which it can be mounted. The monolithic V-Step-Optic guarantees the highest levels of efficiency for diode lasers.

Figure 2A:
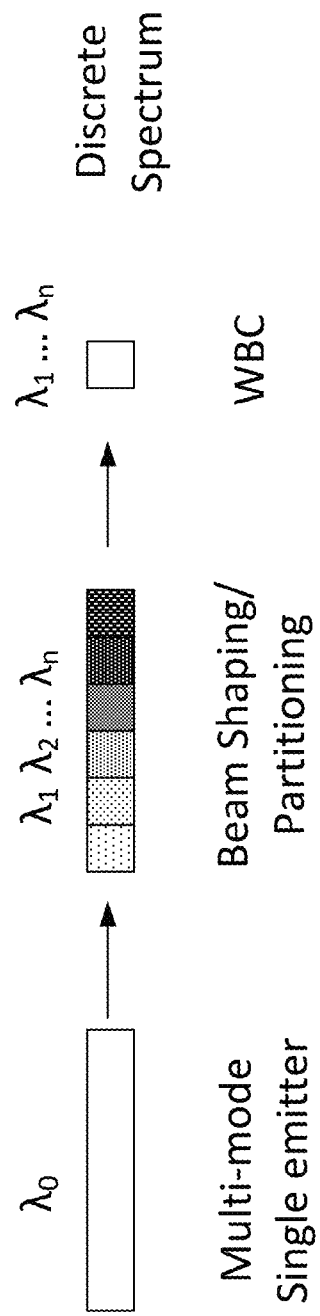
FIG. 2A is a schematic illustrating the steps of partitioning a single emitter and performing a WBC step on the beam portions.

Other companies such as FISBA and LIMO also produce various beam transformation components. After inserting a beam shaping optic, a WBC step is then performed, which locks each partitioned emitter to a specific wavelength ($\lambda 1, \lambda 2, \ldots, \lambda n$ as illustrated in FIG. 2A) and spatially recombines all of the partitioned emitters into the equivalent single partition. The output beam now has all of the spectral components ($\lambda 1, \lambda 2, \ldots, \lambda n$) but has the brightness of that of a single partition.

In one embodiment the number of equal parts the single emitter is portioned into is approximately equal to the $M^2$ value of the beam. E.g. if the beam has an $M^2$ value of 10 then the beam would be divided into 10 equal parts. Often asymmetric beams have an $M^2$ value that is diffraction limited along one dimension i.e. equal to 1 and greater than 1 along the other dimension. For example, a beam may have an $M^2$ value of 20×1. With this value dividing the beam into 20 equal parts creates 20 1×1 portions that can be combined using a WBC step. The beams do not always have to be divided according to the $M^2$ value, but by doing so enables the individual beam portions to be combined closer to the diffraction limit. In many cases the resulting beam after partitioning and performing WBC has an $M^2$ value less than 5, less than 3, less than 2 and in some cases 1 or very nearly 1.

Figure 2B:
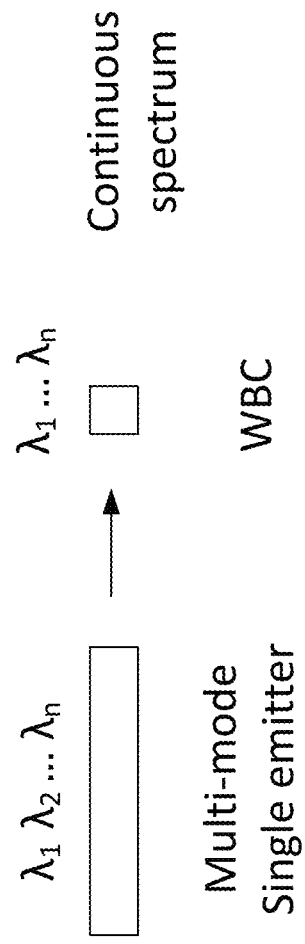
FIG. 2B is a schematic illustrating the steps of performing WBC across a single laser emitter.

In another embodiment, an alternative approach foregoes using beam shaping optics. WBC is performed directly on the multi-mode single emitter, resulting in a continuous, rather than discrete, spectrum after the WBC step is performed (FIG. 2B). Similar to above the $M^2$ value of the resulting output beam is in part determined by the angle of convergence onto the dispersive element wherein the resulting $M^2$ value may be closer to 1. The width of single emitter beams to be used may be great than 40, 100, 200, 400 and upwards of 600 microns or greater.

Selective Repositioning for Multi-emitter WBC system

Figure 3A:
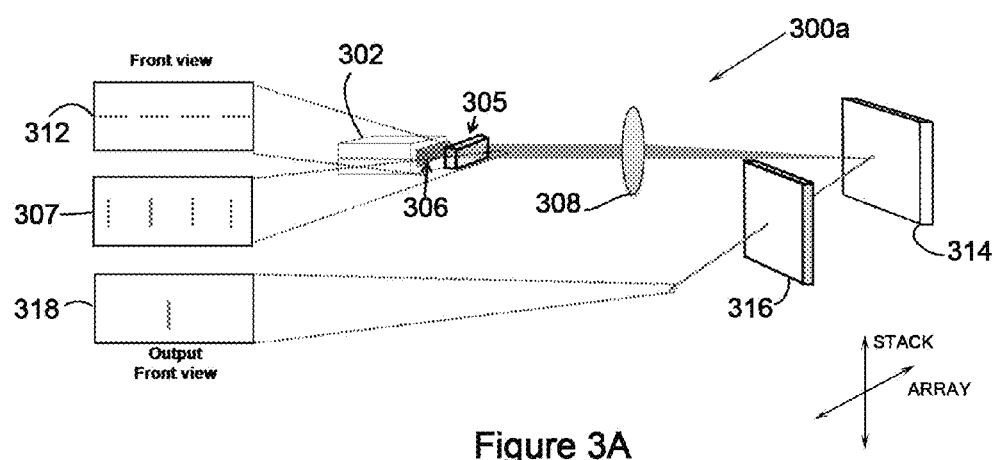
FIG. 3A is a schematic of a WBC system including an optical rotator selectively rotating a one-dimensional array of beams.

FIG. 3A shows a schematic of multi-emitter WBC system 300a with an optical rotator 305 placed after collimation lenses 306 and before the transform optic 308. It should be noted the transform optic 308 may be comprised of a number of lenses or mirrors or other optical components. The optical rotator 305 individually rotates the fast and slow dimension of each emitted beam shown in the input front view 312 to produce the re-oriented front view 307. It should be noted that the optical rotators can selectively rotate each beam individually irrespective of the other beams or can rotate all the beams through the same angle simultaneously. It should also be noted that a cluster of two or more beams can be rotated simultaneously. The resulting output after WBC is performed along the array dimension is shown in output front view 318 as a single emitter. Dispersive element 314 is shown as a reflection diffraction grating, but may also be a dispersive prism, a grism (prism+grating), transmission grating, and Echelle grating. This particular embodiment illustrated shows only four laser emitters; however, as discussed above this system could take advantage of a laser diode array that included many more elements, e.g., 49. This particular embodiment illustrated shows a single bar at a particular wavelength band (example at 976 nm) but in actual practice it can be composed of multiple bars, all at the same particular wavelength band, arranged side-by-side. Furthermore, multiple wavelength bands (example 976 nm, 915 nm, and 808 nm), with each band composing of multiple bars, can be combined in a single cavity. WBC performed across the fast dimension of each beam allows for a system with a higher brightness (higher efficiency due to insensitivity due to bar imperfections). Additionally, narrower bandwidth and higher power output are all achieved.

Figure 3B:
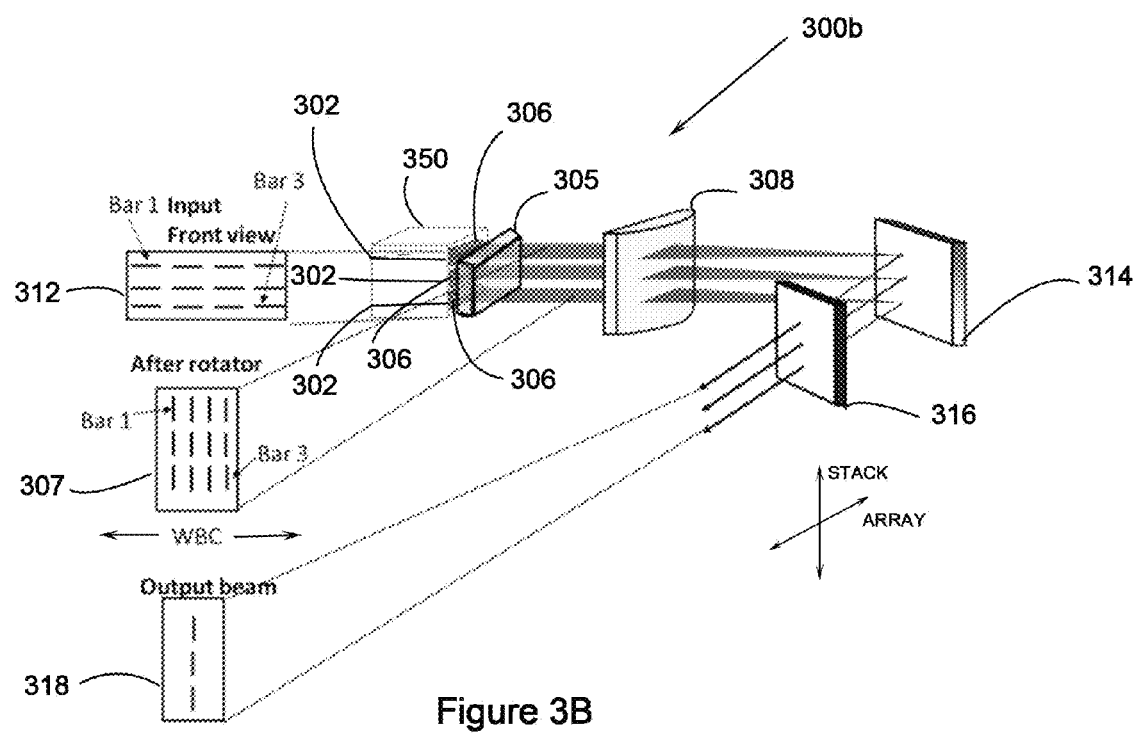
FIG. 3B is a schematic of a WBC system including an optical rotator selectively rotating a two-dimensional array of beams

FIG. 3B, shows an implementation similar to 3A except that a stack 350 of laser arrays 302 forms a 2-D input profile 312. Cavity 300b similarly consists of collimation lens(es) 306, optical rotator 305, transform optic 308, dispersive element 308 (here a diffraction grating), and an output coupler 316 with a partially reflecting surface. Each of the beams is individually rotated by optical rotator 305 to form an after rotator profile 307. The WBC dimension is along the array dimension, but with the rotation each of the beams will be combined across their fast axis. Fast axis WBC produces outputs with very narrow line widths and high spectral brightness. These are usually ideal for industrial applications such as welding. After transform optic 308 overlaps the rotated beams onto dispersive element 314 a single output profile is produced and partially reflected back through the cavity into the laser elements. The output profile 318 is now comprised of a line of three (3) beams that is quite asymmetric.

Figure 3C:
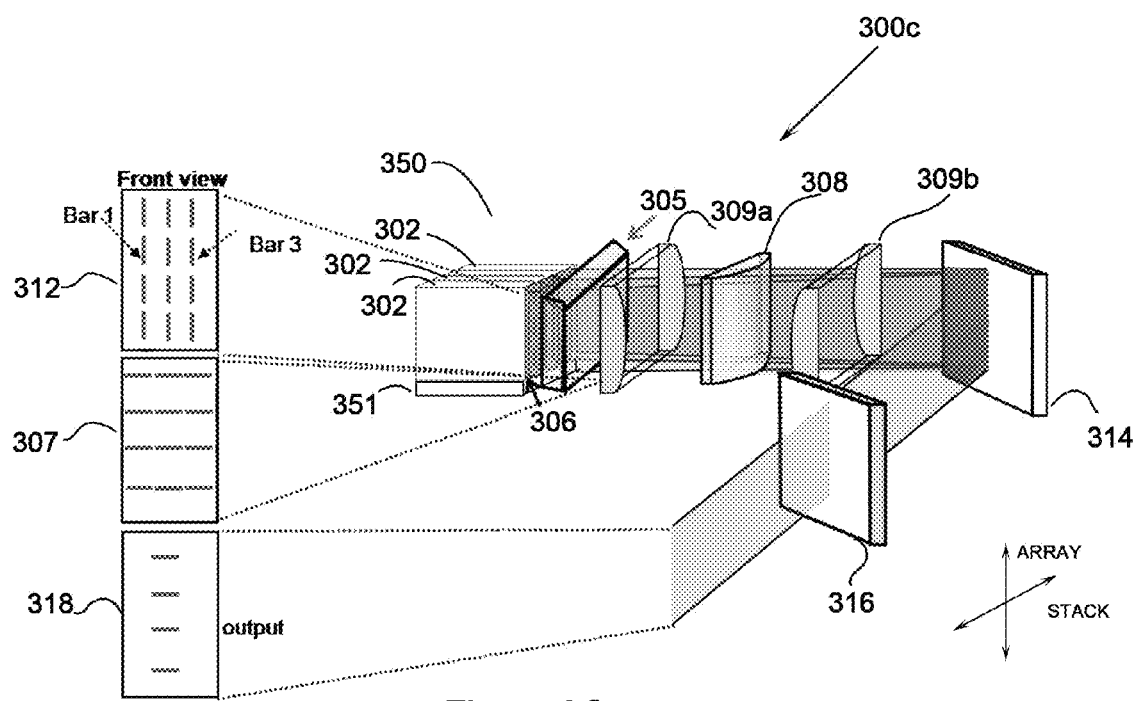
FIG. 3C is a schematic of a WBC system including an optical rotator selectively reorienting a two-dimensional array of beams.

FIG. 3C shows the same implementation when applied to 2-D laser elements. The system consists of 2-D laser elements 302, optical rotator 305, transform optical system (308 and 309a-b), a dispersive element 314, and a partially reflecting mirror 316. FIG. 3C illustrates a stack 350 of laser diode bars 302 with each bar having an optical rotator 305. Each of the diode bars 302 (three total) as shown in external cavity 300c includes four emitters. After input front view 312 is reoriented by optical rotator 305, reoriented front view 307 now the slow dimension of each beam aligned along the stack dimension. WBC is performed along the dimension, which is now the slow axis of each beam and the output front view 318 now comprises single column of beams with each beam's slow dimension oriented along the stack dimension. Optic 309a and 309b provide a cylindrical telescope to image along the array dimension. The function of the three cylindrical lenses are to provide two main functions. The middle cylindrical lens is the transform lens and its main function is to overlap all the beams onto the dispersive element. The two other cylindrical lenses 309a and 309b form an afocal cylindrical telescope along the non-beam combining dimension. Its main function is to make sure all laser elements along the non-beam combining are propagation normal to the partially reflecting mirror. As such the implementation as shown in FIG. 3C has the same advantages as the one shown in FIG. 1C. However, unlike the implementation as shown in FIG. 1C the output beam is not the same as the input beam. The number of emitters in the output beam 318 in FIG. 3C is the same as the number of bars in the stack. For example, if the 2-D laser source consists of a 3-bar stack with each bar composed of 49 emitters, then the output beam in FIG. 1C is a single bar with 49 emitters. However, in FIG. 3C the output beam is a single bar with only 3 emitters. Thus, the output beam quality or brightness is more than one order of magnitude higher. This brightness improvement is very significant for fiber-coupling. For higher power and brightness scaling multiple stacks can be arranged side-by-side.

To illustrate this configuration further, for example, assume WBC is to be performed of a 3-bar stack, with each bar comprising of 19 emitters. So far, there are three options. First, wavelength beam combining can be performed along the array dimension to generate 3 beams as shown in FIG. 1B. Second, wavelength beam combining can be performed along the stack dimension to generate 19 beams a shown FIG. 1C. Third, wavelength beam combining can be performed along the array dimension using beam rotator to generate 19 beams as shown FIG. 3C. There are various trade-offs for all three configuration. The first case gives the highest spatial brightness but the lowest spectral brightness. The second case gives the lowest spatial brightness with moderate spectral brightness and beam symetrization is not required to couple into a fiber. The third case gives the lowest spatial brightness but the highest spectral brightness and beam symmetrization is required to couple into an optical fiber. In some applications this more desirable.

Figure 3D:
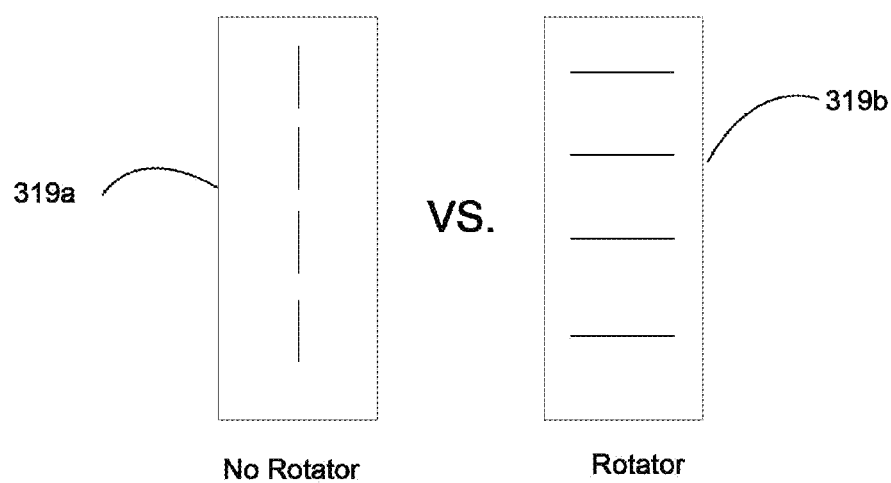
FIG. 3D illustrates output profile views of the system of FIG. 3c with and without an optical rotator.

To illustrate the reduction in asymmetry, FIG. 3D has been drawn showing the final output profile 319a where the system of 300b did not have an optical rotator and output profile 319b where the system includes an optical rotator. Though these figures are not drawn to scale, they illustrate an advantage achieved by utilizing an optical rotator, in a system with this configuration where WBC is performed across the slow dimension of each beam. The shorter and wider 319b is more suitable for fiber coupling than the taller and slimmer 319a.

Optical Rotators and Transformation Optics

As previously discussed, optical rotators and transformation optics may be used to assist combining multiple emitters along a specific dimension (e.g. slow or fast axis). These optical transformation optics may also be used with the single emitter system to partition the emitter into components to later have a WBC step performed thereon. For a single emitter, the partitioning and WBC may be configured to be performed along both the slow and fast axis.

Figure 4A:
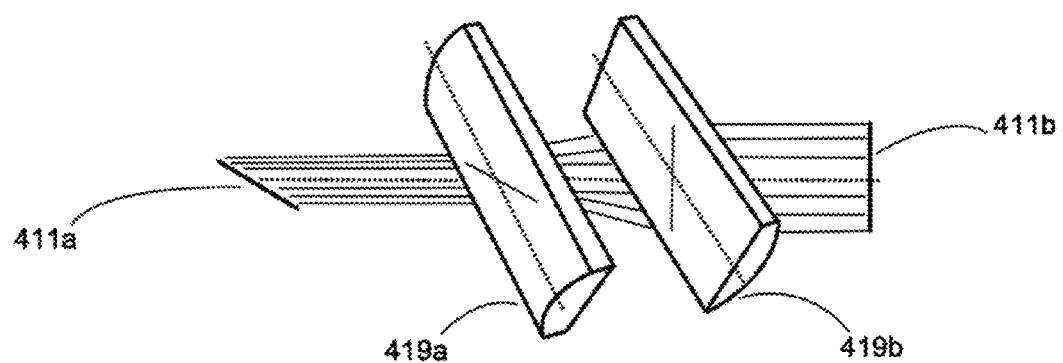
FIGS. 4A-C illustrate examples of optical rotators and transformation optics.
Figure 4B:
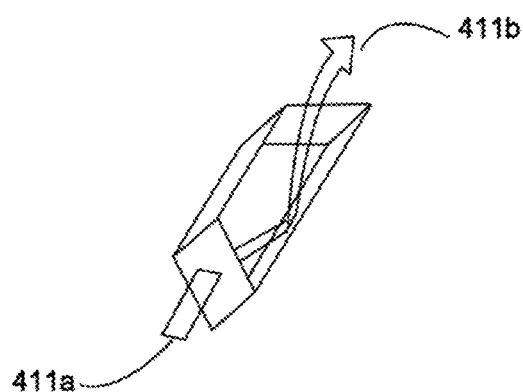
Figure 4C:
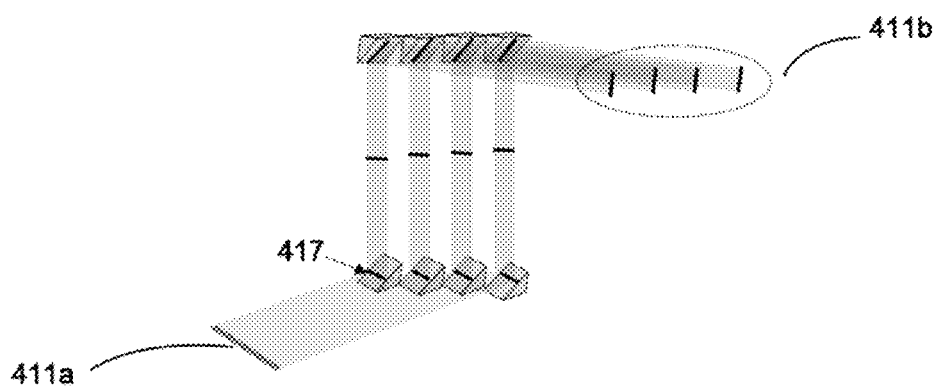

An example of various optical rotators are shown in FIG. 4A-C. FIG. 4A illustrates an array of cylindrical lenses (419a and 419b) that cause input beam 411a to be rotated to a new orientation at 411b. FIG. 4B similarly shows input 411a coming into the prism at an angle, which results in a new orientation or rotation beam 411b.

FIG. 4C illustrates an embodiment using a set of step mirrors 417 to cause a single element input 411a to be partitioned into various segments, rotated at an 80-90 degree angle with respect to the other segments resulting in a new alignment where beam segments 411b are side by side along the fast axis.

These devices and others may cause rotation through both non-polarization sensitive as well as polarization sensitive means. Many of these devices become more effective if the incoming beams are collimated in at least the fast dimension. It is also understand that the optical rotators can selectively rotate the beams at various including less than 90 degrees, 90 degrees and greater than 90 degrees.

The optical rotators in the previous embodiments may selectively rotate individual, rows or columns, and groups of beams. In some embodiments a set angle of rotation, such as a range of 80-90 degrees is applied to the entire profile or subset of the profile. In other instances, varying angles of rotation are applied uniquely to each beam, row, column or subset of the profile. For instance, one beam may be rotated by 45 degrees in a clockwise direction while an adjacent beam is rotated 45 degrees in a counterclockwise direction. It is also contemplated one beam is rotated 10 degrees and another is rotated 70 degrees. The flexibility the system provides can be applied to a variety of input profiles, which in turn helps determine how the output profile is to be formed.

Although the focus of this application has been on the MID-IR range, the principles may apply to wavelengths outside of those ranges that are determined by the emitters and gratings used.

The above description is merely illustrative. Having thus described several aspects of at least one embodiment of this invention including the preferred embodiments, it is to be appreciated that various alterations, modifications, and improvements may readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A diode pump comprising:
   a single diode emitter emitting a single multi-mode beam, the multi-mode beam comprising a plurality of discrete wavelengths and having a beam size;
   a portioning element configured to portion the multi-mode beam into a plurality of partitions, each partition comprising only one of the wavelengths of the multi-mode beam and having a partition size smaller than the beam size, the beam size substantially equaling a sum of the partition sizes;
   a combining element configured to receive and converge each partition onto a dispersive element, wherein the dispersive element transmits the converged partitions; and
   a partially-reflective output coupler arranged to receive the converged partitions from the dispersive element, to reflect a portion of the converged partitions toward the dispersive element, and to transmit an output beam having (i) the plurality of wavelengths and (ii) a size substantially equal to one of the partition sizes.

2. The diode pump of claim 1, further comprising an optical rotator configured to rotate the partitions prior the partitions being converged onto the dispersive element.

3. The diode pump of claim 1, wherein the output beam has an $M^2$ value less than 3.

4. The diode pump of claim 1, wherein the single diode emitter has a width greater than 100 microns.

5. The diode pump of claim 1, wherein the number of partitions is equal to the $M^2$ value along a length of the multi-mode beam.

6. A diode pump comprising:
   a single diode emitter emitting a single multi-mode beam, the multi-mode beam comprising a plurality of discrete wavelengths and having a beam width;
   a combining element configured to receive and converge only the single multi-mode beam along a first dimension onto a dispersive element, wherein the dispersive element transmits a reduced beam having a width less than the beam width; and
   a partially-reflective output coupler arranged to receive the reduced beam from the dispersive element, to reflect a portion of the reduced beam toward the dispersive element, and to transmit an output beam having (i) the plurality of wavelengths and (ii) an $M^2$ value less than 3.

7. A method for reducing the emission $M^2$ value of a single diode emitter that emits a single multi-mode beam having (i) a plurality of discrete wavelengths, (ii) a first $M^2$ value along a first dimension of the multi-mode beam, and (iii) a second $M^2$ value along a second dimension of the multi-mode beam, the first $M^2$ value being greater than the second $M^2$ value, the method comprising:
   along the first dimension of the multi-mode beam:
   causing only the multi-mode beam to converge onto a dispersive element and be dispersed, thereby forming a dispersed beam, and
   transmitting the dispersed beam onto a partially reflective output coupler, thereby (i) causing a first portion of the dispersed beam to reflect back towards the dispersive element and into the single diode emitter, and (ii) transmitting a second portion of the dispersed beam through the partially reflective output coupler, the second portion of the dispersed beam having (a) the plurality of wavelengths and (b) an $M^2$ value less than the first $M^2$ value.

8. A method for reducing the emission $M^2$ value of a single diode emitter that emits a single multi-mode beam having (i) a plurality of discrete wavelengths, (ii) a first $M^2$ value along a first dimension of the multi-mode beam, and (iii) a second $M^2$ value along a second dimension of the multi-mode beam, the first $M^2$ value being greater than the second $M^2$ value, the method comprising:
   along the first dimension of the multi-mode beam:
   portioning the multi-mode beam into a plurality of partitions, each partition comprising only one of the wavelengths of the multi-mode beam and having a partition size smaller than the beam size, the beam size substantially equaling a sum of the partition sizes;

causing the partitions to converge onto a dispersive element and be dispersed, thereby forming a plurality of dispersed beams, and transmitting the plurality of dispersed beams onto a partially reflective output coupler, thereby (i) causing a first portion of the plurality of dispersed beams to reflect back towards the dispersive element and into the single diode emitter, and (ii) transmitting a second portion of the plurality of dispersed beams through the partially reflective output coupler, the second portion of the plurality of dispersed beams constituting an output beam having (a) the plurality of wavelengths and (b) an $M^2$ value less than the first $M^2$ value.

9. The method of claim 8, wherein the multi-mode beam is portioned into a plurality of equal partitions.

10. The method of claim 9, wherein the number of equal partitions is approximately equal to the first $M^2$ value.

* * * * *